United States Patent [19]

Hunter, Jr. et al.

[11] Patent Number: 4,472,296

[45] Date of Patent: Sep. 18, 1984

[54] BULK, POLYCRYSTALLINE SWITCHING MATERIALS FOR THRESHOLD AND/OR MEMORY SWITCHING

[75] Inventors: Orville Hunter, Jr.; Joseph A. Schaefer, both of Ames, Iowa

[73] Assignee: Iowa State University Research Foundation, Inc., Ames, Iowa

[21] Appl. No.: 390,355

[22] Filed: Jun. 21, 1982

[51] Int. Cl.³ ............................................. H01B 1/06
[52] U.S. Cl. .................................... 252/519; 252/521; 252/518; 338/13; 338/20; 338/21; 338/309; 264/61; 264/65; 264/66; 264/104
[58] Field of Search ............... 252/518, 519, 521; 338/20, 13, 312, 121, 313; 264/61, 62, 65, 66, 104; 29/610 R, 621, 622; 75/206, 214, 221

[56] References Cited

U.S. PATENT DOCUMENTS

| 4,254,070 | 3/1981 | Yodogawa et al. | 252/518 X |
| 4,265,844 | 5/1981 | Yokomizo et al. | 252/518 |
| 4,272,411 | 6/1981 | Sokoly et al. | 252/518 |

Primary Examiner—Josephine Barr
Attorney, Agent, or Firm—Zarley, McKee, Thomte, Voorhees & Sease

[57] ABSTRACT

A new group of bulk polycrystalline materials which are capable of exhibiting, selectively, either memory switching or threshold switching. The body of the material, which can be molded into a suitable ceramic resistor configuration with ohmic electrodes and a sintered body composition, comprises as a majority proportion zinc oxide with the balance being another polycrystalline inorganic oxide such as bismuth oxide, cobalt oxide, chromium oxide, antimony oxide, praseodymium oxide, lanthanum oxide, holmium oxide and manganese oxide, or mixtures thereof.

5 Claims, 2 Drawing Figures

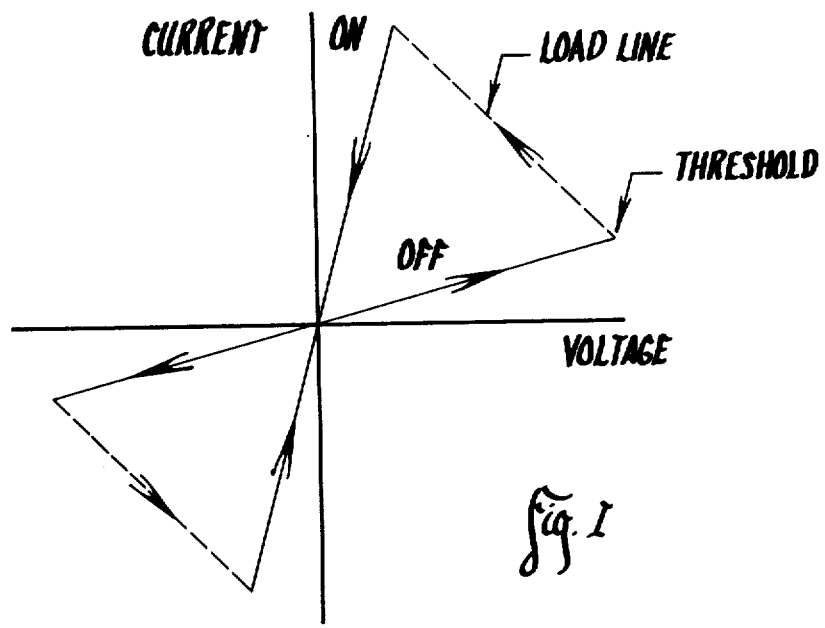
Fig. I
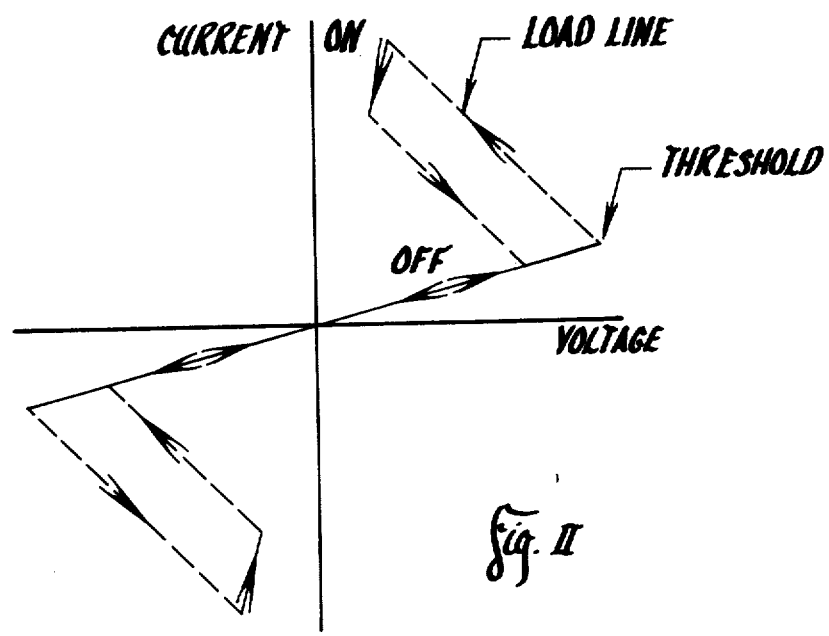
Fig. II

BULK, POLYCRYSTALLINE SWITCHING MATERIALS FOR THRESHOLD AND/OR MEMORY SWITCHING

BACKGROUND OF THE INVENTION

This invention relates to improved switching materials which exhibit Ovonic switching properties. Ovonic switching phenomena have been known and reported in the past for numerous thin film amorphous semi-conductors. The so-called Ovonic switching properties can be broken into two categories, namely, threshold switching and memory switching. Each has its particular uses in solid state physics and electronics.

Threshold switching refers to the phenomena in which a material acts as an insulator and blocks current until a voltage of just the right threshold is applied, at which point the material suddenly becomes a conductor and passes current and the voltage sustained across the sample decreases. The device continues to pass current as long as the required voltage is applied, but when the voltage drops below a critical value, referred to as the holding voltage, the device again goes into the resistance or blocking state.

Contrasted with "threshold switching" is "memory switching". A memory switching device also switches from blocking to conducting when a threshold voltage is applied, but it then remains in the conducting state even when the current is turned off. In other words, it remembers the "on" state. Thus, the device has a memory of the last state that it was in.

The threshold switching phenomena and the memory switching phenomena have been known and both have been exhibited by thin film, or amorphous semi-conductors, first discovered by Mr. Stanford R. Ovshinsky. However, thin film amorphous semi-conductors are difficult to produce, require highly skilled labor and much expense in their production, and are limited in usage because they can dissipate only a limited amount of power. Thus, thin film amorphous semi-conductors have often been limited for potential commercial use.

There is therefore a real and continuing need for switching materials other than the known thin film amorphous semi-conductors. Accordingly, it is a primary objective of the present invention to prepare switching materials, in bulk form, which are polycrystalline ceramic materials which are capable of exhibiting threshold switching or memory switching, depending upon the precise composition.

Another objective of the present invention is to develop a new and unique switching material which is a polycrystalline ceramic composed, primarily, of zinc oxide plus additives of other inorganic oxides.

Another objective of the present invention is to prepare polycrystalline ceramic switching materials which can be prepared by standard ceramic processing methods, such as dry pressing and firing.

Yet another objective of the present invention is to prepare a switching material by standard ceramic processing methods which can be prepared in bulk form so that they can act not only as switching materials, but can also simultaneously serve as a substrate or a mechanical support material in an electrical or physical-electrical device.

Another objective of the present invention is to prepare a switching material, which can be either a threshold switching material or a memory switching material, which is made up of rather stable oxides, such that sintering can be done in an atmosphere of air, so that atmospheric control, such as is required in preparing thin film amorphous semi-conductors, is not necessary.

An even further objective of the present invention is to prepare ceramic switching materials which display either memory switching or threshold switching, depending upon the composition of the other inorganic oxides mixed with the major portion of zinc oxide.

A still further objective is to prepare the first ever, polycrystalline ceramic material which displays threshold switching.

Another objective is to prepare switching materials which, unlike previously produced amorphous semiconductor materials, can be formed by ceramics in bulk, rather than formed as fragile, difficult to produce, and expensive thin film glasses, or single crystal layer compounds such as stannous sulfide or zirconium sulfide.

The method and manner of accomplishing each of these objectives as well as others, will become apparent from the detailed description of the invention which will follow hereinafter.

BRIEF DESCRIPTION OF THE DRAWINGS

FIG. 1 shows the current-voltage relationship in graph form for memory switching.

FIG. 2 shows the current-voltage relationship in graph form for threshold switching.

DETAILED DESCRIPTION OF THE PREFERRED EMBODIMENT

Before proceeding with the detailed description of the switching material compositions of this invention, it has heretofore been mentioned that one of the primary advantages of the ceramic materials is that they can be formed in bulk form and configuration similar to variable resistors now in standard usage. Like conventional variable resistors, these are comprised of a core of the ceramic material, that is, a sintered body having a pair of electrodes. The sintered body is prepared in a conventional manner, and is in any form, such as circular, square, rectangular, cylindrical or the like. Wire leads are attached conductively to the electrodes, positioned at the opposite ends of the ceramic body by conventional connecting means such as solder or the like.

The drawings show the current-voltage relationship in graph form for both memory switching and threshold switching. They depict visually the difference between the two.

Memory switching is characterized by the voltage-current relationship shown in FIG. 1. When the applied voltage reaches a threshold value, the "off" resistance of the material decreases very rapidly along the load line to the on value. Subsequently, when the voltage is reduced the material stays in the low resistance "on" state. On the other hand, threshold switching is characterized by the voltage current relationship shown in FIG. 2. When the applied voltage reaches a threshold value the "off" resistance of the material decreases very rapidly along the load line to the "on" value. In this case, as the applied voltage is decreased, the current decreases along the "on" line until a critical holding value. At this voltage, the material switches very rapidly back to the higher "off" resistance. The effect is usually symmetrical with respect to polarity of the applied voltage.

Earlier, some description of the threshold switching phenomena and the memory switching phenomena has been given herein. These are now known, only as applied to thin film amorphous semi-conductors. For a further detailed discussion of these two phenomena in thin film amorphous semi-conductors, see, *Scientific American* "Amorphous Semi-Conducting Switching", H. K. Henisch, Vol. 221, No. 5, page 30, Nov., 1965, which is incorporated herein by reference; and see also, Ovshinsky, Science, Vol. 165, pp. 673–677, Aug. 5, 1969, which is also incorporated by reference.

As heretofore mentioned, these sintered bodies can be prepared by well-known ceramic techniques. Starting materials are dry mixed so as to produce homogeneous mixtures. The mixtures are then calcined in a furnace at temperatures of from about 500° C. to about 900° C. for periods varying from one to three hours. They are then furnace cooled to room temperature. Thereafter, the mixtures are then pressed into desired shapes at pressures ranging from about 800 pounds per square inch to about 1500 pounds per square inch. The pressed bodies are sintered in air at a given temperature ranging from 1000° C. to about 1400° C. for from about one hour to about three hours, and then furnace cooled to room temperature.

Thereafter, the sintered bodies may be lapped at the opposite surfaces on silicon carbide abrasion wheels. They are then provided with ohmic electrodes, as heretofore described.

The compositions which are useful for preparing the switching materials of this invention comprise from about 70.0 mole % to about 99.6 mole % of polycrystalline zinc oxide, with the balance being another oxide selected from the group consisting of bismuth oxide, cobalt oxide, chromium oxide, antimony oxide, praseodymium oxide, lanthanum oxide, holmium oxide and manganese oxide. Further, as will be apparent from the description hereinafter, mixtures of these oxides each with the other and then with zinc oxide may also be employed. The precise compositions of the other oxides mixed with the zinc oxide will vary. However, in every instance, with the mixtures of oxides mentioned herein, one will either achieve threshold switching or memory switching. Actual preparation of the composition, together with sintering process control appears to be the only determinative way of knowing which composition mixtures achieve one or the other switching phenomena, under sintering conditions.

It is even possible, in some cases, to have the same chemical composition give in one case memory switching and in another, threshold switching by varying the sintering conditions. But again, in every instance either one or the other type of switching is found when the compositions as defined are prepared as described herein.

Another variable, as those skilled in the art well know, is that the power necessary to effect switching of the material will vary somewhat depending upon the thickness of the ceramic core material. For use in this invention, the electrical field across the samples when switching occurs can be as low as 2500 volts per cm in some samples, and as high as 10,000 volts/cm in other samples. Various values between these two extremes will occur in samples of differing composition.

Thickness of the ceramic core material is not critical, but depends upon the power one knows will be used in any given use. For test results of the compositions discussed hereinafter, a disk configuration of a 1 mm. thickness was used.

Uses for the switching materials of this invention can vary widely, across the fields of solid state physics and electronics. They may, for example, be used as surge protectors, switches to control current flow in solid state circuits, read only memories for computers or for solid state electro-luminescent displays, lightning arrestors, and the like.

Threshold switching has been exhibited by the following combinations of oxides:

For all compositions in this table, the sintering temperture was 1200° C., unless otherwise stated.

|   |   |   |   | Sintering Temperature |
|---|---|---|---|---|
| 99 mole % ZnO | 1 mole % $Pr_6O_{11}$ | | | |
| 97.5 mole % ZnO | 2.5 mole % $Pr_6O_{11}$ | | | |
| 95.0 mole % ZnO | 5.0 mole % $Pr_6O_{11}$ | | | 1250° |
| 92.5 mole % ZnO | 7.5 mole % $Pr_6O_{11}$ | | | |
| 90 mole % ZnO | 10 mole % $Pr_6O_{11}$ | | | |
| 99 mole % ZnO | 1 mole % $La_2O_3$ | | | |
| 97.5 mole % ZnO | 2.5 mole % $La_2O_3$ | | | |
| 95.0 mole % ZnO | 5.0 mole % $La_2O_3$ | | | |
| 99.5 mole % ZnO | 0.5 mole % $Ho_2O_3$ | | | |
| 98.0 mole % ZnO | 1 mole % $Pr_6O_{11}$ | 1 mole % $La_2O_3$ | | |
| 95.0 mole % ZnO | 2.5 mole % $Pr_6O_{11}$ | 2.5 mole % $La_2O_3$ | | |
| 90.0 mole % ZnO | 5.0 mole % $Pr_6O_{11}$ | 5.0 mole % $La_2O_3$ | | |
| 85.0 mole % ZnO | 5.0 mole % $Pr_6O_{11}$ | 5.0 mole % $La_2O_3$ | 5 mole % $Co_3O_4$ | |
| 97.0 mole % ZnO | 1.0 mole % $Pr_6O_{11}$ | 1.0 mole % $La_2O_3$ | 1.0 mole % $Cr_2O_3$ | |
| 92.5 mole % ZnO | 2.5 mole % $Pr_6O_{11}$ | 2.5 mole % $La_2O_3$ | 2.5 mole % $Cr_2O_3$ | |
| 85.0 mole % ZnO | 5.0 mole % $Pr_6O_{11}$ | 5.0 mole % $La_2O_3$ | 5.0 mole % $Cr_2O_3$ | |
| 99.0 mole % ZnO | 1.0 mole % $Co_2O_3$ | | | |
| 97.5 mole % ZnO | 2.5 mole % $Co_2O_3$ | | | |
| 95.0 mole % ZnO | 5.0 mole % $Co_2O_3$ | | | |
| 98.0 mole % ZnO | 1.0 mole % $Co_2O_3$ | 1.0 mole % $Pr_6O_{11}$ | | |
| 95.0 mole % ZnO | 2.5 mole % $Co_2O_3$ | 2.5 mole % $Pr_6O_{11}$ | | |
| 90.0 mole % ZnO | 5.0 mole % $Co_2O_3$ | 5.0 mole % $Pr_6O_{11}$ | | |
| 99.0 mole % ZnO | 1.0 mole % $Cr_2O_3$ | | | |
| 97.5 mole % ZnO | 2.5 mole % $Cr_2O_3$ | | | |
| 95.0 mole % ZnO | 5.0 mole % $Cr_2O_3$ | | | |

85 mole % ZnO and 2.5 mole % each of $Co_3O_4$, $Cr_2O_3$, $Sb_2O_3$, $Pr_6O_{11}$, $MnO_2$, $La_2O_3$
95 mole % ZnO and 2.5 mole % each of $Co_3O_4$ and $Cr_2O_3$
90 mole % ZnO and 2.5 mole % each of $Pr_6O_{11}$, $La_2O_3$, $Cr_2O_3$, $Co_3O_4$
90 mole % ZnO and 2.5 mole % each of $MnO_2$, $La_2O_3$, $Cr_2O_3$, $Co_3O_4$
96 mole % ZnO and 1.0 mole % each of $MnO_2$, $La_2O_3$, $Cr_2O_3$, $Sb_2O_3$
90 mole % ZnO and 2.5 mole % each of $MnO_2$, $La_2O_3$, $Cr_2O_3$, $Sb_2O_3$ -continued

| | |
|---|---|
| 80 mole % ZnO and 5.0 mole % each of $MnO_2$, $La_2O_3$, $Cr_2O_3$, $Sb_2O_3$ | |
| 98 mole % ZnO and 0.5 mole % each of $MnO_2$, $La_2O_3$, $Cr_2O_3$, $Sb_2O_3$ | |
| 99.6 mole % ZnO and 0.1 mole % each of $MnO_2$, $La_2O_3$, $Cr_2O_3$, $Sb_2O_3$ | |
| 70 mole % ZnO and 7.5 mole % each of $MnO_2$, $La_2O_3$, $Cr_2O_3$, $Sb_2O_3$ | |
| 95 mole % ZnO and 2.5 mole % each $Bi_2O_3$, $Co_3O_4$ | 1150,1200,1300 |
| 95 mole % ZnO and 1 mole % $Bi_2O_3$, 4 mole % $Co_3O_4$ | 1150,1200,1300 |
| 95 mole % ZnO and 1 mole % $Bi_2O_3$, 4 mole % $Sb_2O_3$ | 1100,1200,1300 |
| 97 mole % ZnO and 2.5 mole % $Bi_2O_3$, 0.25 mole % $MnO_2$, 0.25 mole %, $Sb_2O_3$ | 1100 |
| 95 mole % ZnO and 1.0 mole % $Bi_2O_3$, 2.0 mole % $MnO_2$, 2.0 mole % $Sb_2O_3$ | 1100 |
| 95 mole % ZnO and 4.0 mole % $Bi_2O_3$, 0.2 mole % $MnO_2$, 0.8% mole $Sb_2O_3$ | 1000,1100 |
| 95 mole % ZnO and 4.0 mole % $Bi_2O_3$, 0.8 mole % $MnO_2$, 0.2 mole % $Sb_2O_3$ | 1000,1100 |
| 80 mole % ZnO and 5.0 mole % each $Bi_2O_3$, $MnO_2$, $Sb_2O_3$, $Co_3O_4$ | 1100,1150,1200 |
| 85 mole % ZnO and 3 mole % each $Bi_2O_3$, $MnO_2$, $Sb_2O_3$, $Co_3O_4$, $Cr_2O_3$ | 1100,1250 |
| 97 mole % ZnO and 0.5 mole % each $Bi_2O_3$, $MnO_2$, $Co_3O_4$, $Cr_2O_3$, and 1.0 mole % $Sb_2O_3$ | 1100,1200 |

The two best compositions, identified to date for threshold switching, are: (1) 85 Mole % ZnO and

| | |
|---|---|
| 2.5 mole % each of $Co_3O_4$, $Cr_2O_3$, $Sb_2O_3$, $Pr_6O_{11}$, $MnO_2$, and $La_2O_3$; and (2) 90 mole % of ZnO and 2.5 mole % of $Co_3O_4$, $Cr_2O_3$, $MnO_2$ and $La_2O_3$. | 1200 1200 |

Memory switching has been exhibited by the following combinations of oxides:

| | |
|---|---|
| 99 mole % ZnO and 1.0 mole % $Ho_2O_3$ | 1200 |
| 98 mole % ZnO and 2.0 mole % $Ho_2O_3$ (switches at 50 volts) | 1200 |
| 97.5 mole % ZnO and 2.5 mole % $La_2O_3$ | |
| 95.0 mole % ZnO and 2.5 mole % each $Pr_6O_{11}$, $La_2O_3$ | |
| 90 mole % ZnO and 10 mole % $Bi_2O_3$ | 1000,1100,1200 |
| 95 mole % ZnO and 5 mole % $Bi_2O_3$ | 1000,1100,1200 |
| 99 mole % ZnO and 1.0 mole % $Bi_2O_3$ | 1000,1100,1200 |
| 97 mole % ZnO and 3.0 mole % $Bi_2O_3$ | 1000,1100,1200 |
| 97 mole ZnO, 2.5 mole $Bi_2O_3$ 0.25 mole $mnO_2$ 0.25 mole $Sb_2O_3$ | 1150 |
| 95 mole ZnO, 1.0 mole $Bi_2O_3$, 2.0 mole $mnO_2$, 2.0 mole $SB_2O_3$ | 1150,1120 |
| 95 mole ZnO, 4.0 mole $Bi_2O_3$, 0.8 mole $mnO_2$, 0.2 mole $SB_2O_3$ | 1300 |

The composition which seems to give the best memory switching consists of 98 mole % ZnO with 2.0 mole % of $Ho_2O_3$.

It can be seen that the common denominator in all of these compositions is that they consist of a major portion, that is, from about 70.0 to about 99.6 mole % of zinc oxide, in combination with at least one other inorganic oxide selected from the group consisting of bismuth oxide cobalt oxide, chromium oxide, antimony oxide, praseodymium oxide, lanthanum oxide, holmium oxide and manganese oxide. There does not appear to be predictability, as to which compositions will exhibit memory switching, or which will exhibit threshold switching. One merely has to make the compositions in the manner before described, sinter them and test. The compositions mentioned previously herein have all been prepared in the manner described above and in the examples, have been tested and found to exhibit either memory switching, or threshold switching, each of the recited compositions is known to work for one of the two types of switching.

The following illustrative examples are offered to further illustrate, but not limit, the invention. The first demonstrates threshold switching and shows precisely the manner in which the bulk ceramic switching device was prepared.

EXAMPLE I - THRESHOLD SWITCHING

Calculations were made of the weight percentage needed for each component in order to give a composition of 85 mole % ZnO and 2.5 mole % each of $Co_3O_4$, $Cr_2O_3$, $Sb_2O_3$, $Pr_6O_{11}$, $MnO_2$, $La_2O_3$. A 20 gram (total) mixture was prepared using reagent grade chemicals in the following amounts:

| | | | |
|---|---|---|---|
| ZnO | 11.33 grams | $Pr_6O_{11}$ | 4.18 grams |
| $Co_3O_4$ | 0.99 grams | $Sb_2O_3$ | 1.19 grams |
| $Cr_2O_3$ | 0.62 grams | $MnO_2$ | 0.36 grams |
| | | $La_2O_3$ | 1.33 grams |

The chemicals were dry mixed in a polyethylene container. The mixture was then transferred to an alumina crucible which was then placed in a calcining oven. The mixture was calcined in air at 700° C. for one hour and then furnace cooled to room temperature. After cooling, 2.5 grams of calcined powder were placed in a stainless steel mold of cylindrical cross section of ¾ inch diameter and pressed into a disk at 1000 lb/in². The pressed disk was then isostatically pressed at 20,000 lb/in².

The pressed disk was then sintered in air for one hour at 1200° C. and then furnace cooled to room temperature. The sintered disk was then lapped to a nominal thickness of 1 mm by silicon abrasives down to a particle size of 600 mesh.

The electrical behavior of the sample was then checked using a Tektronix type 576 curve tracer. One point probe from the curve tracer made contact with a copper block on which the sample was placed. The other point probe contacted the sample through an electrode on the opposite side of the sample. Various electrodes were used for obtaining electrical contact with the sample including silver conducting paint and a mixture of gallium and indium.

This sample exhibited threshold switching when subjected to 350–400 volts/cm. carrying one milli-amp of current. It switched to 50 volts carrying 250 milli-amps of current.

EXAMPLE II - MEMORY SWITCHING DEVICE

Three samples were prepared, as described in Example I. They comprised a homogeneous mixture of 95 mole % of ZnO, 4% of $Bi_2O_3$ and 1% $Co_3O_4$. A 20 gram sample of this was weighed out on a balance and the components were sealed in a plastic food bag and mixed by hand kneading. The samples were calcined in an electric furnace in an alumina crucible. Calcining and preparation of the bulk polycrystalline material into the resistor configuration was as described in the earlier example. Disks were prepared by isostatic pressure at 20,000 lbs/sq. inch. Sintering was accomplished in a sintering oven at 1200° C. The samples, like those in Example 1, were about 1 mm. thick.

They were then subjected to a voltage on the Tektronix 576 curve tracer, as in Example I, and found to exhibit memory switching.

It thus can be seen that the invention accomplishes at least all of its stated objectives, including Ovonic switching without use of complex thin film semi-conductors.

What is claimed is:

1. A bulk, polycrystalline switching material which exhibits either threshold switching or memory switching, consisting essentially of:
   a suitable resistor configuration having ohmic electrodes and containing a sintered body composition, said sintered body composition comprising from about 70.0 mole % to about 99.6 mole % of polycrystalline zinc oxide, with the balance being another oxide selected from the group consisting of Bismuth Oxide, Cobalt Oxide, Chromium Oxide, Antimony Oxide, Praeseodymium Oxide, Lanthanum Oxide, Holmium Oxide, and Manganese Oxide, or mixtures thereof.

2. A composition of claim 1 which exhibits threshold switching and which is about 85 mole % ZnO, about 2.5 mole % each of $Co_3O_4$, $Cr_2O_3$, $Sb_2O_3$, $Pr_6O_{11}$, $MnO_2$ and $La_2O_3$.

3. A composition of claim 1 which exhibits threshold switching and which is about 90 mole % of ZnO, 2.5 mole % of each of $Co_3O_4$, $Cr_2O_3$, $MnO_2$ and $La_2O_3$.

4. A composition of claim 1 which exhibits memory switching which is about 98 mole % ZnO, with 2.0 mole % of $Ho_2O_3$.

5. A method of producing a bulk, polycrystalline switching material which exhibits either threshold switching or memory switching, said method consisting essentially of:
   dry mixing to a substantially homogeneous state a mixture of oxides, said mixture comprising from about 70.0 mole % to about 99.6 mole % of polycrystalline zinc oxide, and from about 0.4 mole % to about 30 mole % of another oxide selected from the group consisting of Bismuth Oxide, Cobalt Oxide, Chromium Oxide, Antimony Oxide, Praeseodymium Oxide, Lanthanum Oxide, Holmium Oxide and Manganese Oxide, or mixtures thereof:
   calcining said mixture of oxides at temperature of from about 500° C. to about 900° C. for from one to three hours;
   cooling said calcined mixture to about room temperature,
   pressing said mixture into a desired configuration at pressures of from about 800 $lb/in^2$ to about 1500 $lb/in^2$;
   sintering said presssed mixture in air at a temperature ranging from 1000° to 1400° for from about one to about three hours;
   cooling said sintered, pressed mixture to about room temperature; and
   adding ohmic electrodes to said sintered, pressed mixture.

* * * * *